United States Patent [19]

Szasz

[11] 4,236,851
[45] Dec. 2, 1980

[54] DISC HANDLING SYSTEM AND METHOD

[75] Inventor: Peter R. Szasz, Menlo Park, Calif.

[73] Assignee: Kasper Instruments, Inc., Sunnyvale, Calif.

[21] Appl. No.: 867,326

[22] Filed: Jan. 5, 1978

Related U.S. Application Data

[63] Continuation of Ser. No. 778,723, Mar. 17, 1977, abandoned, which is a continuation of Ser. No. 628,496, Nov. 3, 1975, abandoned.

[51] Int. Cl.$^3$ .............................................. B65G 51/02
[52] U.S. Cl. ...................................... 406/72; 406/79; 406/86
[58] Field of Search ................... 302/2 R, 29, 31, 11, 302/12, 13; 271/5, 97, 195; 214/1 BE; 294/64 B; 406/72, 86, 88, 79, 82

[56] References Cited

U.S. PATENT DOCUMENTS

| | | | |
|---|---|---|---|
| 876,987 | 1/1908 | Molinar | 271/5 |
| 3,198,515 | 8/1965 | Pitney | 302/2 R |
| 3,438,668 | 4/1969 | Olsson et al. | 271/97 |
| 3,503,607 | 3/1970 | Gluskin | 302/29 |
| 3,511,495 | 5/1970 | Schonfeld | 271/97 |
| 3,588,176 | 6/1971 | Byrne et al. | 302/29 |
| 3,614,168 | 10/1971 | Range | 302/31 |
| 3,645,581 | 2/1972 | Lasch et al. | 302/2 R |
| 3,797,889 | 3/1974 | Wilkinson | 302/2 R |
| 3,930,684 | 1/1976 | Lasch et al. | 302/2 R |
| 3,948,564 | 4/1976 | Flint | 302/2R |

OTHER PUBLICATIONS

IBM Technical Disclosure Bulletin, vol. 16, No. 9, Feb. 1974; Wafer Stop by Mack et al.; p. 2906.

IBM Technical Disclosure Bulletin, vol. 14, No. 8, Jan. 1972; Wafer Pickup Head by Leoff et al.; pp. 2311–2312.

IBM Technical Disclosure Bulletin, vol. 18, No. 3, Aug. 1975; Lip Design for Track by Cavaleri et al.; p. 698.

Primary Examiner—Jeffrey V. Nase
Attorney, Agent, or Firm—Roland I. Griffin

[57] ABSTRACT

Systems for handling discs, such as semiconductor wafers and the like, using both stationary and movable air track assemblies include an elongate track member, a flat surface formed to extend along the underside of the track member, ports disposed along the flat undersurface for the discharge of air at an angle to the vertical, and provision for discharging a sufficient flow of air from the ports to create a differential in the air pressure above and below the discs so as to lift the discs toward the flat undersurface as a result of the air flow. The angle has a sufficient horizontal vectorial component to urge the discs along the flat undersurface of the track member in the direction of such component. In one embodiment, the air track member extends between a pair of holders which respectively supply and receive discs carried by the track member. The discs may be carried to a predetermined fixed point, released, and subsequently retrieved from the same position. Alternatively, a cyclic carrier may be employed to move the discs out from under the track member. In another embodiment, a cyclic carrier cooperates with a number of air track assemblies, each of which includes only a single holder lacted at one end to either supply or receive discs. A further embodiment includes a pair of movable air track members operable with respect to a stationary location for depositing and retrieving discs therefrom.

16 Claims, 20 Drawing Figures

FIG_1

FIG_2

DISC HANDLING SYSTEM AND METHOD

CROSS-REFERENCES TO RELATED APPLICATIONS

This is a continuation of U.S. patent application Ser. No. 778,723, filed Mar. 17, 1977, now abandoned, which in turn is a continuation of U.S. patent application Ser. No. 628,496, filed Nov. 3, 1975, also now abandoned.

BACKGROUND OF THE INVENTION

This invention pertains to disc-handling systems and methods of a type, for example, particularly useful for transporting semiconductor wafers having a highly sensitive surface which can be very easily damaged or contaminated.

Heretofore, disc-handling systems have suffered from an inherent inability to both put a disc down onto an expansive surface at least co-extensive with the disc and to pick up such a disc without entering beneath or engaging the disc. This limitation has prevented the ready transfer of discs onto and off of surfaces, such as moving belts, rotating tables, stationary pedestals, and other broad surfaces extending beyond the edge of the disc.

Thus, placement of a disc on a chuck has usually required that the disc extend beyond the edge of the chuck so that a portion of the disc can be engaged from beneath in order to lift it. The disc must then be larger than the chuck on which it may be placed for testing, treatment, examination or the like.

Figures 3, 4, 5, 6:
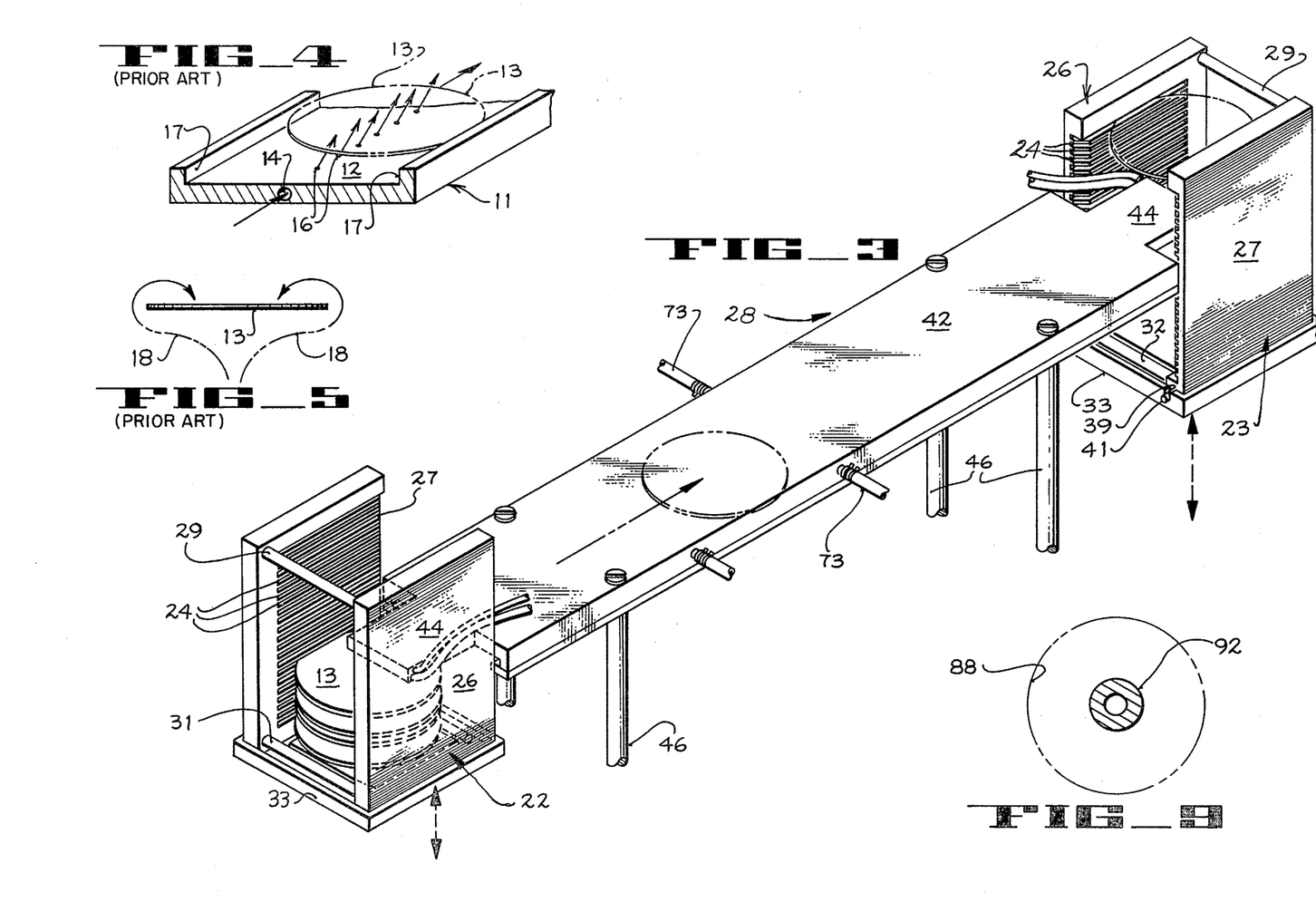
FIG. 3 shows a diagrammatic, perspective, enlarged detail view of an air track cooperating with holders by retaining discs to be transported from one holder to the other according to a preferred embodiment of the invention.
FIG. 4 shows a diagrammatic perspective view of an air track according to the prior art.
FIG. 5 shows an air flow diagram for the prior art air track shown in FIG. 4.
FIG. 6 shows a diagrammatic perspective view partially broken away of the air track of FIG. 3.

In the past, discs such as semiconductor wafers have been transported by means of an air track as may be described with respect to the prior art FIGS. 4 and 5. As shown in FIG. 4, a portion 11 of an air track of the prior art is represented diagrammatically as having a generally flat surface 12 for supporting a generally circular disc 13, such as a semi-conductor wafer. A manifold 14 in the form of a drilled opening extends along the centerline of portion 11 for receiving air under pressure to be discharged via the uniformly spaced outlets 16 at an angle having a vectorial component extending in the direction in which it is desired to transport disc 13. The side edges 17 serve to guide disc 13 along a predetermined path.

In the foregoing type of construction, the top surface of disc 13 is necessarily the sensitized, delicate and easily contaminated precious portion of the disc in view of the fact that, if the air supply is terminated, the disc drops and would therefore scrape along surface 12 damaging any semiconductor configurations or material applied to the undersurface of the disc. FIG. 5 shows a diagram of the upward flow of air 18 which passes around the side edges of disc 13 and swirls downwardly onto the central portion of the top surface of the disc. Any contaminants which may have been entrained in the air stream 18 are therefore deposited on the top surface of the disc.

From inspection of FIG. 4, it is readily evident that, once the air pressure is appropriately adjusted so as to transport a given weight of disc 13, the air pressure will be too great if a much lighter weight disc 13 is dispatched onto the surface 12. In this case the lighter weight disc 13 can be blown from the track, thereby (not infrequently) destroying substantially the entire disc.

An important advantage of the disc-handling system of the present invention is found in its ability to precisely place, retrieve and transport discs relative to a work surface which is larger than the disc itself without engaging or entering beneath the disc so as to permit use of the system with both moving and stationary disc-receiving surfaces. Moreover, the above-described and other problems are believed to have been overcome by the disc-handling system of the present invention.

SUMMARY OF THE INVENTION

In general, there is disclosed a preferred disc transport system and method for moving substantially flat disc elements from a first station to a second station. The system includes a track assembly for receiving and moving the discs between the two stations, the track assembly comprising an elongate member having a substantially flat disc transport surface. Apparatus is provided for supporting this member in a manner such that the disc transport surface thereof faces downwardly. Finally, apparatus is provided for lifting the discs toward the disc transport surface of this member and for moving the discs along that surface while they are suspended by a flow of air between the discs and that surface.

In general, it is an object of the present invention to provide an improved disc-handling system and a method of a type adapted for use, for example, in the handling of semiconductor wafers having extremely delicate surfaces so as not to damage those surfaces while the discs are being handled.

It is another object of the present invention to provide an improved system and method for lifting discs, such as semi-conductor wafers or the like, from above without engaging the discs while carrying them in a given direction.

It is a further object of the present invention to provide an improved system and method for handling discs and transporting them from one station to the next while at the same time excluding contaminants from the sensitive surfaces thereof.

Another object of this invention is to provide a disc-handling system capable of readily transporting discs and putting discs onto and retrieving discs from an expansive surface at least coextensive with the disc without entering beneath the disc.

The foregoing and other objects of the invention will become more readily evident from the following detailed description of preferred embodiments when considered in conjunction with the drawings.

BRIEF DESCRIPTION OF THE DRAWINGS

FIG. 8 shows an enlarged, section detail view of pneumatic apparatus for detecting the proximity of a disc as taken along the line 8—8 of FIG. 6;

FIG. 9 shows a diagrammatic plan view of a portion of the pneumatic apparatus shown in FIG. 8;

DETAILED DESCRIPTION OF THE PREFERRED EMBODIMENTS

Figure 1:
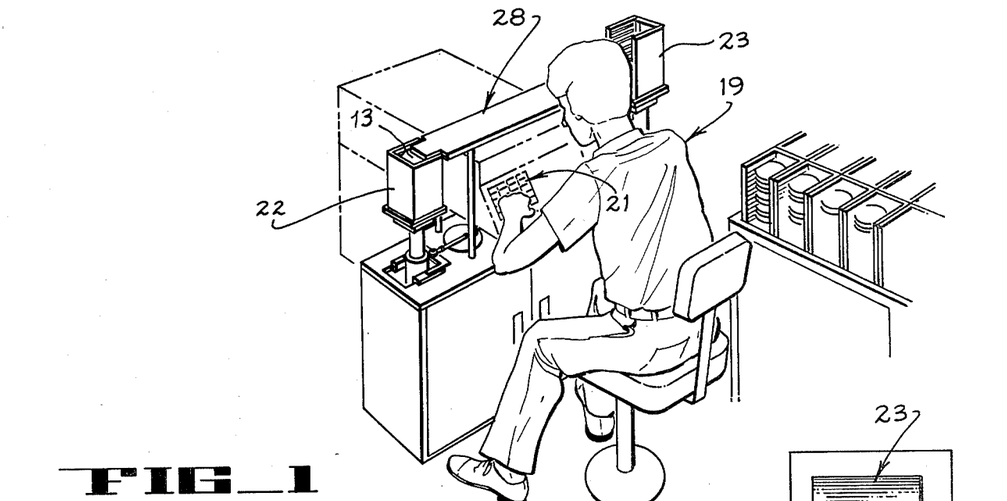
FIG. 1 shows a diagrammatic perspective view of a disc handling system according to a preferred embodiment of the invention.

Referring to FIGS. 1-3 and 6-14, there is shown a disc handling system according to a preferred embodiment of this invention. In FIG. 1, the system is generally shown for use in conjunction with an operator 19 seated in front of a control console 21. The system includes a pair of disc holders 22, 23 flanking the end portions of a disc-transport track assembly 28. Holders 22, 23 are each constructed in substantially the same manner and, as shown in FIG. 3, comprise a pair of substantially parallel side walls 26, 27 maintained in spaced relation from each other by three spacer rods 29, 31 and 32. The confronting surfaces of side walls 26, 27 include spaced-part, substantially parallel slots 24, whereby discs 13 can be readily supported between the side walls 26, 27 in spaced relation to other discs similarly supported. Each of the holders 22, 23 rests loosely upon a separate base plate 33 (see FIG. 11) which is in turn disposed in a readily releasable manner upon the top surface of an associated rectangular support plate 34.

Figures 6, 7, 10, 11:
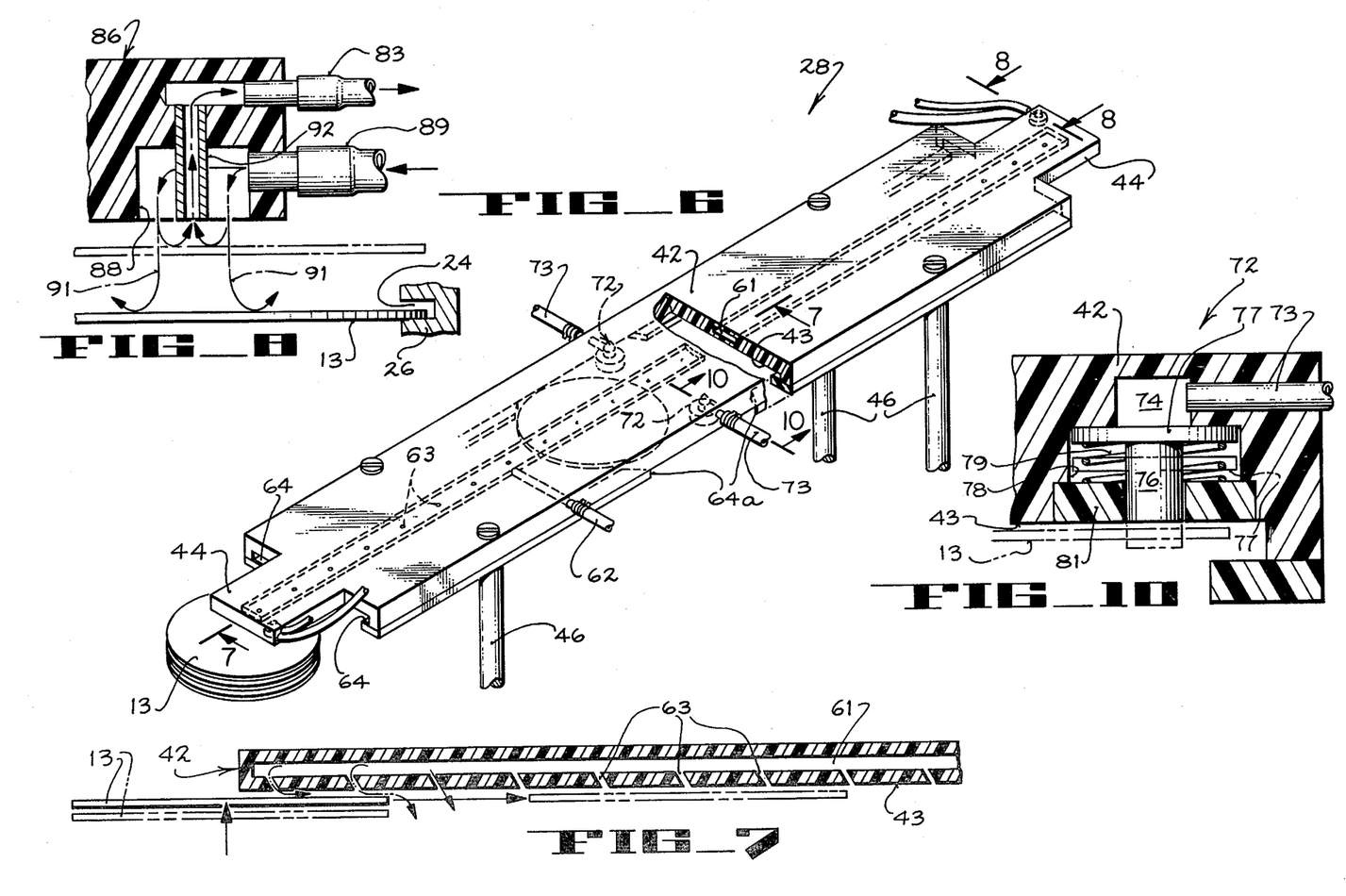
FIG. 7 shows an enlarged sectional view taken along the line 7—7 of FIG. 6.
FIG. 10 shows an enlarged, sectional detail view of a detent for arresting the travel of a disc along the air track of FIG. 6 as taken along the line 10—10 of FIG. 6.
FIG. 11 shows an enlarged perspective view of an assembly for positioning a disc holder relative to a loading/unloading portion of an air track according to a preferred embodiment of the invention.
Figures 11, 12:
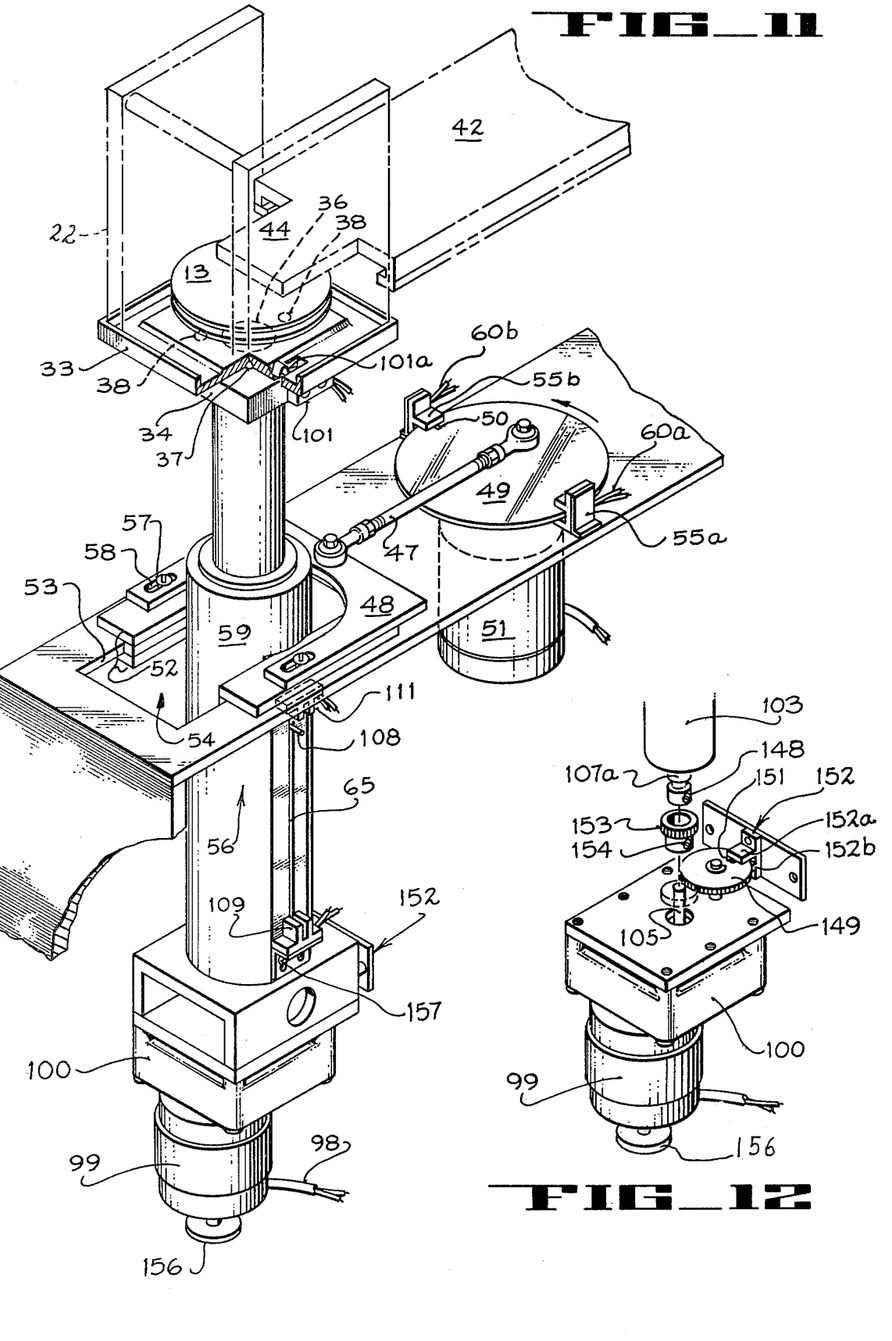
FIG. 12 shows a diagrammatic, exploded perspective view of the bottom portion of the positioning assembly of FIG. 11 with portions of the covers removed.

As shown in FIG. 11 for holder 22, apparatus is provided for retaining and aligning each base plate 33 on its support plate 34. This apparatus includes the exposed circular end of a bar magnet 36 included in support plate 34. Support plate 34 further includes three spaced ball detents 37 disposed to engage correspondingly spaced spherical pockets 38 formed in the undersurface of base plate 33. Accordingly, by making base plate 33 from a magnetic material, the magnet 36 will serve to retain base plate 33 in properly aligned position on the upper surface of support plate 34.

Each base plate 33 includes a notch 39 (see FIG. 3) for receiving a stud 41 protruding forwardly from side wall 27 of each holder 22, 23. This serves to insure that the holders 22, 23 will be properly oriented on their respective base plates 33 before commencement of operation.

Track assembly 28 (see FIG. 1) is arranged to receive and carry discs 13 between two stations as defined in the preferred embodiments of FIGS. 1-3 and 6-14 by disc holders 22, 23. As shown in FIGS. 3 and 6, track assembly 28 includes an elongate track member 42 having a substantially flat disc transport surface 43. Track member 42 includes end portions 44 formed to enter between the confronting side walls of disc holders 22, 23 for lifting discs therein from above. As diagrammatically shown, suitable supports 46 support track member 42 in a manner such that disc transport surface 43 faces downwardly.

Apparatus is provided for moving holders 22, 23 between retracted and advanced positions to dispose end portions 44 of track member 42 over a portion of the discs 13 contained within holders 22, 23. Accordingly, as shown best in FIG. 11 for holder 22, a crank arm 47 is coupled at one end to a yoke 48 and at the other end to a drive wheel 49 supported for rotation on the shaft of a motor 51 of a type arranged and adapted to provide 180° of rotation during each operation thereof. Ways 52 are formed by a U-shaped structure engaging the edge 53 of an opening 54 through which there is disposed an elevator assembly 56.

Figure 2:
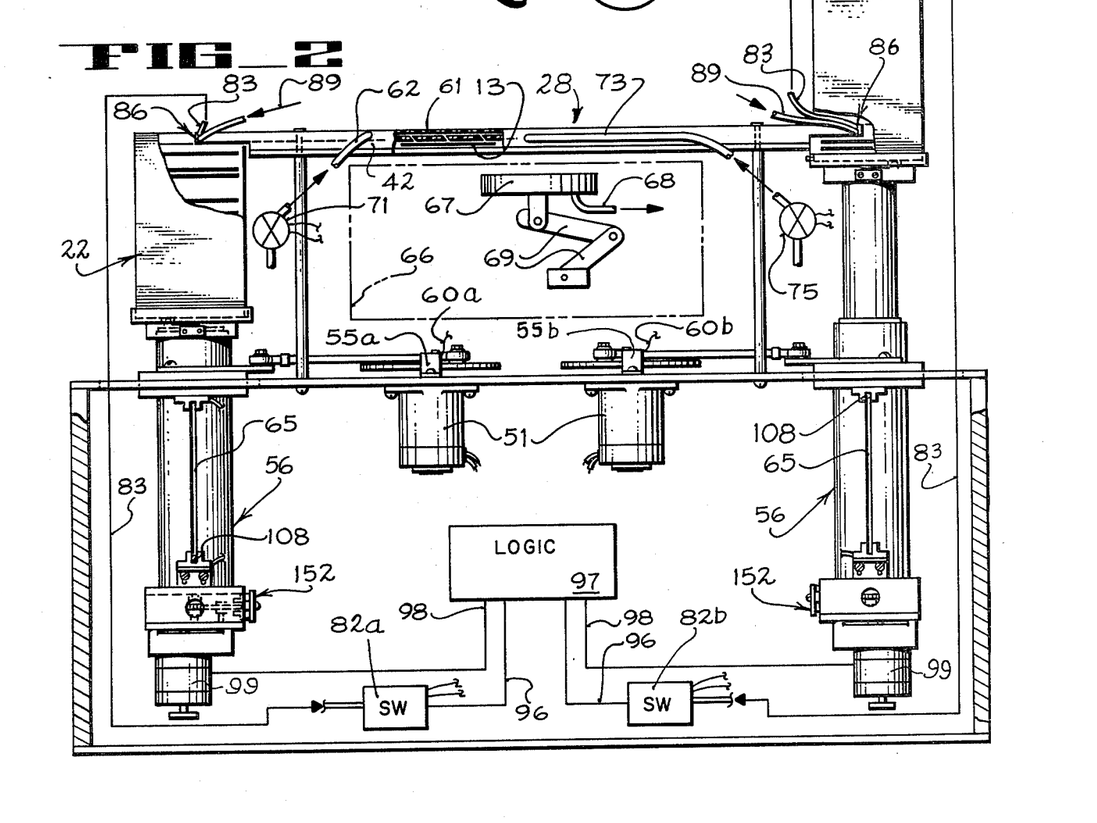
FIG. 2 shows a diagrammatic elevation view partially in section of a system of the type shown in FIG. 1.

Yoke 48 is adjustably coupled to ways 52 by means of screws 57 and slots 58. Ways 52 are fixed to the side of housing 59 of elevator assembly 56 so that as crank arm 47 moves between advanced and retracted positions, elevator assembly 56 will be moved between advanced and retracted positions relative to member 42 thereby disposing discs 13 immediately beneath one end portion 44 of member 42. As shown in FIG. 2, similar apparatus is provided for disposing discs 13 immediately beneath the other end portion 44 of track member 42.

Apparatus is also provided for determining whether or not a disc holder 22, 23 is disposed in its retracted or advanced position relative to member 42. Accordingly, as shown best in FIG. 11 for holder 22, the peripheral edge portion of drive wheel 49 includes a notch 50. Two photoresponsive sensors 55a, 55b are disposed opposite one another adjacent to the peripheral edge portion of drive wheel 49. Each of these sensors includes a pair of elements flanking the peripheral edge portion of drive wheel 49 and including, for example, a light source and a photoresponsive element, respectively, so that as notch 50 becomes disposed at one or the other of the two sensors 55a, 55b an electrical signal is generated on one or the other of leads 60a, 60b coupled into logic 97 (see FIG. 2). Accordingly, as shown in FIG. 11, the position of drive wheel 49 is such that crank arm 47 has been moved to its advanced position thereby drawing elevator assembly 56 toward one end portion 44 of member 42. The position of notch 50 with respect to sensor 55b provides an electrical signal on lead 60b indicating that the track member 42 is ready to cooperate with discs 13 in holder 22. When sensor 55a detects the presence of notch 50, a similar electrical signal is provided on lead 60a to indicate that holder 22 and track member 42 are separated.

As will be described further below, apparatus is also provided for moving each holder 22, 23 between lowered and raised positions with the corresponding end portion of track member 42 disposed between the side walls of the holder. Apparatus is further provided for sensing the proximity of a disc 13 in the holder as it arrives at a predetermined spacing from the corresponding end portion 44 of the track member. Upon sensing the proximity of a disc approaching the corresponding end portion 44, the sensing apparatus serves to arrest further upward movement of the holder at substantially the predetermined spacing from end portion 44 whereby end portion 44 is capable of lifting that disc and transporting it along surface 43 of track member 42 (see FIG. 6). During transport, each disc 13 is suspended by a flow of air passing between surface 43 and the top of the disc, as will now be described.

Referring now to FIGS. 6 and 7, the apparatus for moving discs 13 along surface 43 of track member 42 while suspended by a flow of air or gas defined between the discs and surface 43 includes a manifold 61 for receiving air under pressure therein via an inlet 62. A series of spaced ports or jets 63 extend between manifold 61 and surface 43 and are disposed at an angle to surface 43 so as to discharge air under pressure downwardly against a disc 13 for lifting and transporting the disc in response to the air discharging from the ports. It has been observed that with a disc 13 spaced sufficiently close to surface 43, as air or other gas is discharged from manifold 61, a sufficient flow of air is created across the upper surface of the disc so as to create an upwardly acting pressure differential between the pressure above and the pressure below the disc and cause the disc to move upwardly to a position where it is suspended by the air flowing between disc and surface 43. The fact that the air or other gas is discharged at an angle serves to introduce a vectorial component extending in the direction of the desired movement so as to urge the disc in that given direction.

This method of lifting and transporting a disc 13 is substantially different than the method employed in prior art systems of the type described above in connection with FIGS. 4 and 5. In those systems a disc 13 is lifted on the basis of creating a greater static pressure beneath the disc to simply lift it upwardly without relying on air flow across the upper surface of the disc.

Referring again to FIGS. 6 and 7, it will be readily evident that any failure of air flow will permit a disc 13 that has been lifted and partially transported along the length of surface 43 of track member 42 to fall freely from beneath track member 42. Such an eventuality is undesirable, and, accordingly, safety flanges 64 are provided beneath the marginal edges of surface 43 to permit the suspending air stream to be interrupted without losing discs 13 from track member 42.

Having in mind that the upper surface of a disc 13 tyically is the sensitive surface, the disc-handling system described herein is well suited for disposing discs onto and retrieving them from a work station or treatment device subsequently requiring each disc to be picked up after it has been treated or examined. Accordingly, as shown in FIG. 2, a work station 66 is disposed beneath track assembly 28 and provided with a suitable type of chuck 67 (formed with tiny holes on its upper surface to provide a vacuum clamping action at that location from suction applied via an air hose 68) that can be used to hold a disc to be treated. As used herein, the term "treating" is used to include all manner of handling, inspection, diffusion of materials, and other manipulation of discs 13 of a type, for example, normally encountered in the manufacture of semiconductor devices.

Articulated arms 69 support chuck 67 whereby it can be variously moved beneath track member 42 for receiving a disc 13. Typically, chuck 67 would be disposed in a single location, and flanges 64 would be cut away as at 64a (see FIG. 6) so as to permit release of a disc 13 when it is located in position above chuck 67. Apparatus for arresting movement of a disc 13 along track member 42 at a position overlying chuck 67 and for discharging the disc from the track member to the chuck for treatment thereon as well as for retrieving the disc so discharged is provided, as will now be described.

As shown in FIGS. 2 and 6, flanges 64 are formed in a manner so that they can be interrupted, such as indicated at 64a, to permit a disc 13 to drop at a position located immediately above chuck 67 when the air supply is discontinued to the manifold 61 as, for example, by means of a valve 71. Apparatus for arresting movement of a disc 13 at the position located immediately above chuck 67 so as to dispose disc 13 in appropriate position for later release onto the chuck includes pneumatically-operated springloaded stops 72 operated from air supply lines 73 disposed on opposite sides of track member 42. As shown best in FIG. 10, each of the stops 72 includes an air chamber 74 supplied with air under pressure entering along air line 73 as controlled by an electrically controlled valve 75 (see FIG. 2). An elongate cylindrical arresting element 76, formed with a piston head or disc 77, is disposed for movement between extended and retracted positions disposed axially within an enlarged chamber 78. A coil spring 79 encircles arresting element 76 and is captured between piston head 77 and an antifriction plug 81 (retained in the underside of track member 42 so as to be flush with surface 43) to normally retain arresting element 76 in its retracted position as shown in solid lines in FIG. 10. Accordingly, as air pressure is supplied to chamber 74, piston head 77 is driven downwardly against the force of spring 79 to move arresting element 76 downwardly into the path of a disc 13 moving along surface 43. This extended position of arresting element 76 is shown in phantom lines in FIG. 10.

Apparatus for selectively operating stops 72 to extend arresting elements 76 from their retracted to their extended positions includes means, such as valve 75 (see FIG. 2) disposed in air supply lines 73 and arranged to be electrically operated by the leads associated therewith. Console 21 (see FIG. 1) can be readily coupled to operate valve 75 in response to the operator's instructions, or valve 75 can be coupled to operate in response to suitable logic circuitry 97 (see FIG. 2) as desired.

With a disc 13 arrested by means of the downward protrusion of arresting elements 76 on both sides of the track member 42, the disc 13 will be positioned immediately above chuck 67 which may be manually or remotely positioned by suitable known controls. Termination of the air flow to manifold 61 serves to release disc 13 from track member 42 onto chuck 67. The manner of treating the substrate or disc can take various forms, all known those versed in the semiconductor technology, and such treatment forms no part of the present invention. After treatment, inspection, or the like, the disc must then be picked up from chuck 67 by the air track for further transport into receiving holder 23.

Accordingly, apparatus is shown in FIG. 2 for relatively moving chuck 67 and track member 42 into closely spaced relation to permit track member 42 to pick up the disc 13 from chuck 67 for further transport along the track member to the receiving holder 23. This is effected by merely positioning chuck 67 so as to locate disc 13 sufficiently close to surface 43 to permit the air stream passing out of ports 63 to lift the disc up to a suspended position adjacent to surface 43 and to urge the disc forwardly along track member 42.

Typically, when discs 13 are transferred from one holder 22 to another, such as holder 23, the disc-receiving holder will be positioned to place each disc that it receives in successive slots therein whereas discs need not necessarily be present in each of the successive slots of the holder which supplies the discs. Accordingly, in the holder 22 being unloaded, only some of the slots may contain discs. Thus, in the case of an upwardly moving holder that has been drawn inwardly toward the track member 42 to dispose an end portion 44 (see FIG. 3) over the open upper end of the holder, each disc must be detected as it approaches end portion 44. In short, if a disc is not properly detected as the holder is moving upwardly under the above conditions, one or all of the discs in that holder can be destroyed. Accordingly, apparatus for detecting the presence of a disc in a holder at a predetermined spacing from the corresponding end portion 44 of track member 42 is coupled to control the apparatus for moving the holder upwardly so as to arrest movement of the holder to dispose each disc 13 at substantially the aforementioned predetermined spacing from surface 43 of the corresponding end portion 44.

As shown in FIGS. 2, 8, and 9, apparatus for detecting proximity of an approaching disc 13 held in a slot 24 of a holder such as 22 or 23 comprises a sensor head assembly 86 including a plenum chamber 88 forming a nozzle for downwardly directing air 91 received via an air line 89. Sensor head assembly 86 further includes a coaxial tube 92 disposed centrally in plenum chamber 88 to form a return passage for air deflected upwardly from a disc located immediately beneath sensor head assembly 86. An air return line 83 is coupled to an associated one of two pneumatic switches 82a, 82b so that the slight increase in air pressure caused by the deflected flow of air via tube 92 can be readily sensed. Upon actuation of one or the other of the two air-actuated switches 82a, 82b, a signal on a corresponding lead 96 is fed to suitable logic circuitry 97 for providing a discontinuance of power via a lead 98 to drive motor 99 of the appropriate one of the two elevator assemblies 56.

Apparatus is provided for incrementally elevating each of the holders 22, 23 between lowered and raised positions as best shown in FIGS. 11–14 for holder 22. The holder is placed on a base plate 33, which rests on the top of support plage 34 and is held firmly thereon by means of magnet 36 acting on the material of the base plate 33. A microswitch 101 carried along one side of support plate 34 includes a movable leaf spring 101a extending upwardly through an opening 102 formed in one edge of base plate 33. Placing a holder on base plate 33 depresses leaf spring 101a and closes microswitch 101 so as to provide by suitable electrical connections an indication to the logic circuit 97 (see FIG. 2) that a holder has been properly seated on support plate 33 in position to receive (or discharge) discs 13.

Elevator assembly 56, which serves to raise and lower base plate 33 between its lowered and raised positions, comprises an elongate, movable, hollow post 103 disposed to move longitudinally of the elevator assembly. Post 103 is guided at its upper end by an annular bearing 104 of anti-friction material, such as a thermoplastic resin [—(—OCH$_2$—)n] for general purpose injection molding sold under the trademark "Delrin". Bearing 104 is lock threaded into the upper end of housing 59. The lower end of post 103 includes a nut 106 fixed therein for receiving a lead screw 107, which rotates in place under the driving action of motor 99. A bearing 110 supports the lower end of lead screw 107. As lead screw 107 rotates in one direction, a protruding finger 108 carried by post 103 prevents rotation of nut 106 and post 103 so that nut 106 will be moved downwardly along with post 103 and base plate 33. Conversely, a reverse rotation of lead screw 107 tends to lift base plate 33.

Apparatus for detecting when base plate 33 has been moved to its raised up and lowered bottom positions includes finger 108 extending radially through slot 65 formed along housing 59. Finger 108 is sensed as it passes between two confronting portions of a transducer 109 or a transducer 111. Transducers 109, 111 can, for example, be optical or can be magnetic whereby a magnetic field exists between the two confronting portions of each transducer. In the latter case, upon passage of the finger 108, which would then be made of suitable magnetic material, between the two confronting portions of either of the transducers 109 or 111, the magnetic field is interrupted and a signal is generated for indicating that nut 106 (and, hence, base plate 33) has been moved either to one or the other of its two extreme positions.

Figures 13, 14, 18:
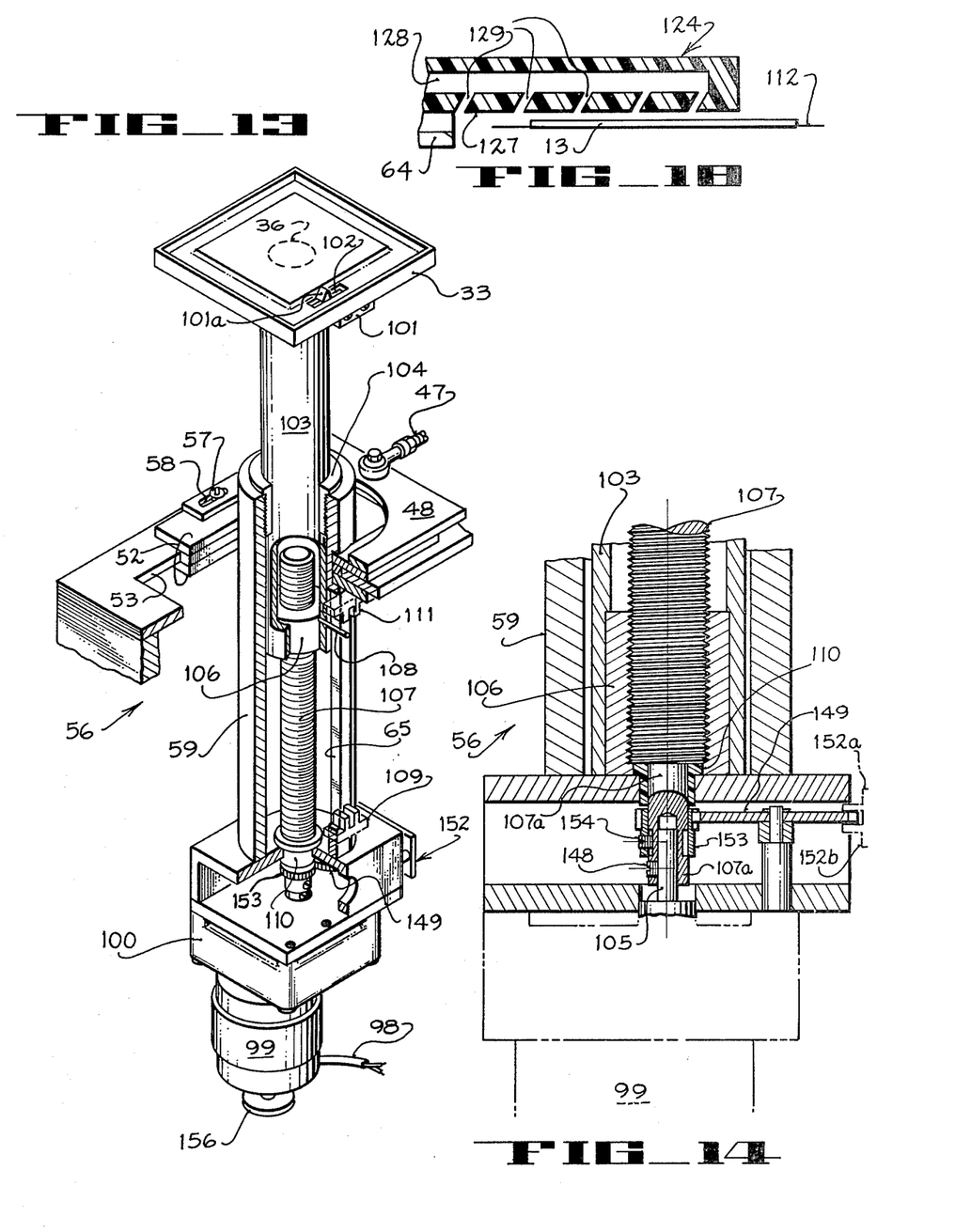
FIG. 13 shows a diagrammatic perspective view with portions broken away of the positioning assembly of FIG. 11.
FIG. 14 shows an enlarged sectional view of the coupling formed between the drive motor and the bottom of the lead screw shown in FIG. 13.
FIG. 18 shows an enlarged, sectional detail view of the outer end of air tracks 124 shown in FIG. 15.

Apparatus for coupling motor 99 to drive nut 106 between its lowered and raised positions in a manner to permit fine adjustment of those two extreme positions will now be described. Lead screw 107, coupled to motor 99, lifts and lowers post 103 within housing 59 by means of the traveling nut 106, which is secured to post 103. Lead screw 107 includes a mounting stub 107a having a hollow bore for receiving a drive stub 105 therein of motor 99. A set screw 148 couples mounting stub 107a to the drive stub 105 from gear box 100.

Apparatus is provided for detecting predetermined increments of travel of nut 106 (and, hence, of post 103). This apparatus comprises a counting gear 149 formed with a slot 151 therein disposed to pass between opposed parts of a sensor 152, such as photoresponsive device having a light source in one part 152a and a photoresponsive element in the other part 152b to provide an electrical signal for each passage of slot 151 between parts 152a and 152b. A sleeve gear 153 is carried on mounting stub 107a and secured thereto by a set screw 154 carried in gear 153 and acting against the reduced circumference of mounting stub 107a. Means for manually rotating lead screw 107 includes a knob 156 located beneath motor 99.

The coupling above described, together with an adjustable mounting 157 for bottom sensor 109, permits base plate 33 to be initially adjusted relative to the position of the corresponding end portion 44 of track member 42 to compensate for slight variations in the height of track member 42 from one machine to the next.

From the foregoing, it will be readily evident that there is provided an air track for transporting discs therealong featuring an elongate track member, a flat surface formed to extend along the underside of the track member, and ports disposed along that surface for the discharge of air downwardly at an angle relative to that surface. Provision is made for discharging a sufficient flow of air from these ports to create a differential in the air pressure above and below the discs so as to lift the discs toward the flat surface as a result of air flow across the upper side of the discs. The angle of discharge of the air has a sufficient horizontal vectorial component so as to urge the discs along the flat surface in the direction of that vectorial component.

It is also evident that the method of transporting relatively flat discs from a first station to a second station can be achieved utilizing the manipulative steps of discharging air downwardly from a flat surface of a track member at spaced intervals and at an angle having a vectorial component extending in the direction of movement desired for the disc; disposing a disc at a position sufficiently proximate to that flat surface to permit the downwardly discharging air to create an upwardly acting pressure differential between the pressure above and below the disc thereby causing the disc to move into confronting relation with that surface while spaced therefrom by the thickness of the air flow passing therebetween; and permitting the vectorial component of the discharging air to move the disc in the direction desired along that flat surface. Further steps may include selectively blocking the path of movement of the disc at a predetermined point in the travel thereof; and terminating the discharge of air to permit the disc to drop downwardly after positioning a disc-receiving device in the downward path of movement of the disc to engage and support the disc for handling. These further steps provide for selectively releasing a disc from the track member for processing, examination or other treatment purposes. Following processing, examination or other handling of the disc, additional steps can be employed. These include recommencing the discharge of air downwardly; and positioning the disc-receiving device so as to bring the disc sufficiently proximate to the flat surface of the track member to permit the discharge of air to lift the disc and to advance the disc along the track member.

Figures 15, 16, 17:
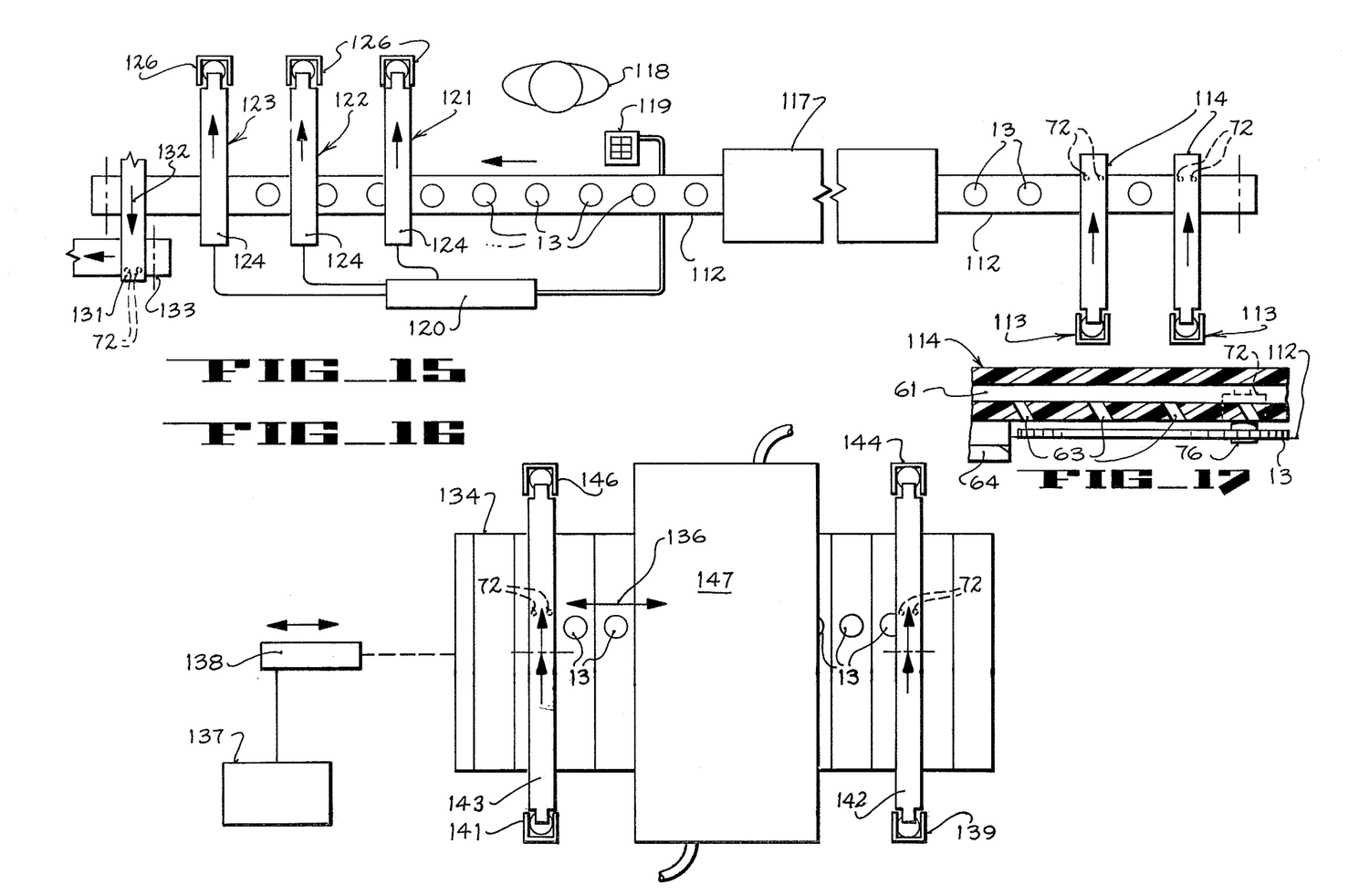
FIG. 15 shows a diagrammatic plan view of another preferred embodiment of the invention.
FIG. 16 shows a diagrammatic plan view of still another preferred embodiment of the invention.
FIG. 17 shows an enlarged, sectional detail view of the outer end of air tracks 114 shown in FIG. 15.

In the preferred embodiment of the invention shown in FIGS. 15 and 16, the disc transport system for handling and transporting discs comprises a cyclically moving carrier, apparatus for depositing discs onto the carrier, and apparatus for retrieving discs from the carrier. The apparatus for depositing discs includes at least one member having an elongate surface overlying the carrier at one end and having ports formed in that elongate surface for discharging air downwardly at an angle thereto for lifting and carrying discs to a position overlying the carrier so that they can be discharged onto the carrier. Similarly, the apparatus for retrieving discs includes at least one member having an elongate surface overlying the carrier at one end but having ports in that elongate surface for discharging air downwardly at an angle thereto for lifting discs from the carrier and carrying them suspended from and along that elongate surface to another location.

In the preferred embodiment shown in FIG. 15, the carrier 112 comprises an elongate cyclic belt. The apparatus for depositing discs 13 onto carrier 112 comprises at least one pair of disc holder and positioning assemblies 113 of the type described above. Air tracks 114 substantially of the type described above extend in overlying relation above carrier 112 so as to be able to deposit discs 13 onto the transversely moving surface of carrier 112. As shown best in FIG. 17, the discs 13 may be deposited on carrier 112 by using stops 72, terminating the underlying safety flanges 64 of each air track 114, and controlling air to the series of ports 63 of each air track 114 in the same manner as described above.

A treatment station 117 disposed proximate to carrier 112 and discs 13 thereon serves to treat the discs as they move either through or immediately beneath the treatment station for proper semiconductor treatment or other type of treatment as is known. Upon emerging from treatment station 117, discs 13 pass in view of an operator 118 who is provided with suitable selection controls 119 and logic circuitry 120 whereby discs 13 can be retrieved by a selected one of three unloading stations 121, 122, 123. Each of these unloading stations 121-123 is formed with an air track 124 of the type described generally above but with the direction of the air discharge ports 63 being disposed at an angle serving to move the discs 13 toward the associated disc holder 126. Thus, as shown in FIG. 18, the outer end of each air track 124 is formed with an underlying smooth, flat surface 127 and a manifold 128, which as described above continue to the end of air track 124. Air discharge ports 129 are disposed to discharge air downwardly and at an angle (with respect to surface 127) having a horizontal component directed away from the closed outer end of manifold 128. In this way, a flow of air is discharged against the upper surface of discs 13 sufficiently to create the pressure differential referred to above and also to move the discs toward the associated disc holder 126. Accordingly, as selected by the operator 118, disc 13 can be supplied to various holders 126.

It has further been observed that it may be desirable to transport discs from one location to another. This can be done by employing a transfer track 131 of a construction similar to that of air tracks 124 whereby discs 13 can be picked up from carrier 112, moved in the direction of arrow 132, and ultimately deposited onto a second carrier 133 by virtue of the lack of any additional air discharge ports formed in the outer end of transfer track 131.

In the preferred embodiment shown in FIG. 16, there is diagrammatically shown a cyclic carrier 134 arranged to move back and forth in the directions of arrows 136 as determined by suitable controls 137 and an oscillating drive motor 138 mechanically coupled to carrier 134. Discs 13 are unloaded from a pair of stations 139, 141 and deposited onto carrier 134 by means of air tracks 142, 143 of the type described above. Another pair of stations 144, 146 is disposed at the other ends of tracks 142, 143 for receiving discs retrieved from the surface of carrier 134. A treatment station 147 overlies carrier 134 so that, for example, as discs 13 are deposited onto carrier 134 from air track 142, they are carried through the environment of treatment station 147 as carrier 134 moves in the direction of the right-hand arrow 136 and, if desired, can then be picked up by air track 142 and stored in the receiving station 144. In the event that more than one exposure to treatment station 147 is necessary, the discs 13 can be left on carrier 134 during its return travel as it moves in the direction of the left-hand arrow 136 and can then be picked up by air track 143 and stored in its associated receiving station 146.

From the foregoing, it will be readily evident that there has been provided an improved and simplified system for more carefully handling discs of a fragile type. This sytem is particularly useful for handling semiconductor wafers which are readily aubject to contamination. The system disclosed has the advantages of employing a flow of air (or other suitable gas) which removes contamination from the surface of the discs.

Moreover, the system requires no change in the gas discharge rate in order to switch from lifting heavier discs to lifting lighter weight discs. Accordingly, discs of various weight can be loaded intermittently in a holder without need for adjustment of pressure in view of the fact that the discs cannot be inadvertently discharged from the system by blowing them out of the track and the continuous presence of a protective layer of gas flowing between the discs and the surface of the track prevents contact between the discs and the track. A highly versatile disc transport system is therefore provided by employing apparatus of the kind described above in combination with a carrier.

Accordingly to another embodiment of the invention, a disc transport and retrieval system is arranged for purposes of inspection or other treatment of each disc at a predetermined location. In this system a pair of independently operated disc transport assemblies are pivotally arranged for movement between advanced and retracted positions to deposit discs on and retrieve discs from an inspection pedestal.

Figure 19:
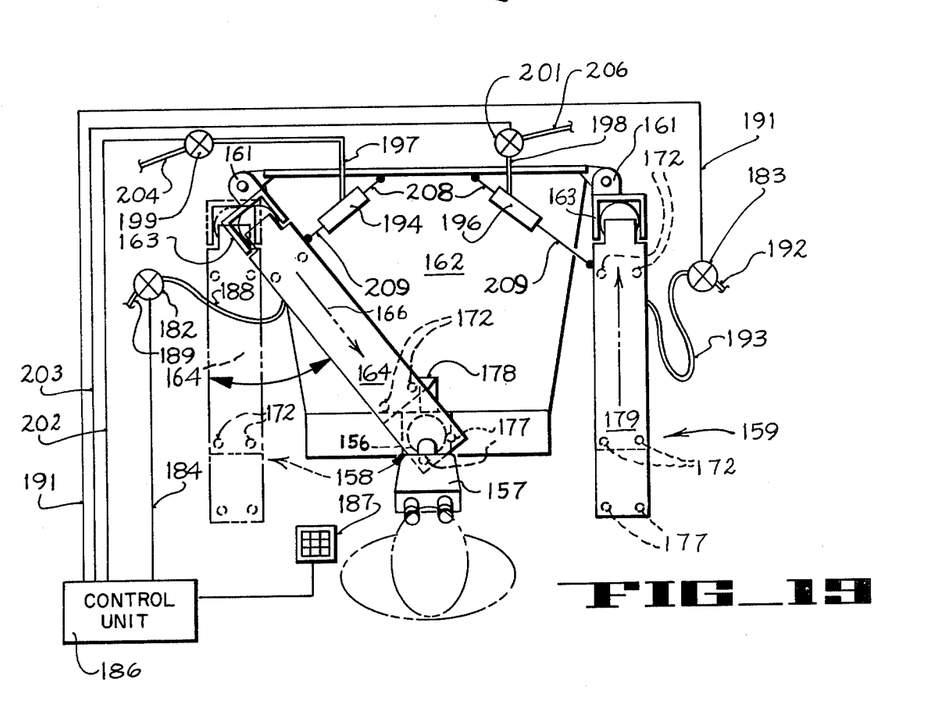
FIGS. 19 and 20 show diagrammatic plan and perspective views, respectively, of yet another preferred embodiment of the invention.
Figure 20:
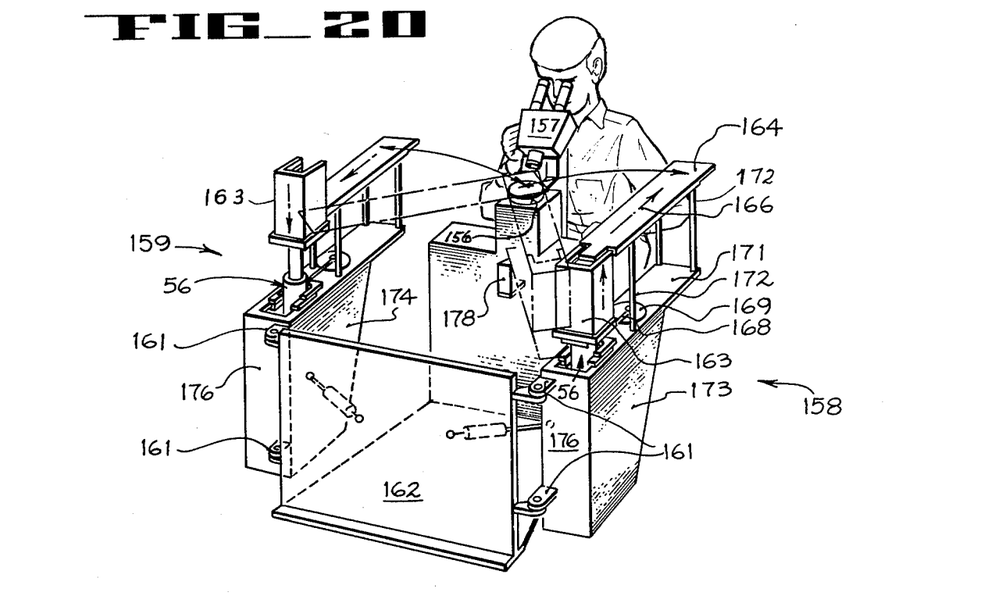

As shown in FIGS. 19 and 20, a stationary pedestal 156 is adapted to support a disc, such as a semiconductor wafer, for inspection as by means of a microscope 157. Each of a pair of disc transport assemblies 158, 159 is pivotally supported as by means of hinges 161 to an upstanding portion of a stationary base assembly 162.

Disc transport assembly 158 serves to move discs one at a time out of an associated holder 163 of the above-described type for travel along the length of an associated track member 164 of a type generally comparable to track member 142 (described above) for transporting discs in the direction of arrow 166 until arrested by means of the pneumatically operated stops 177 comparable to stops 72 (described above). With the exception that transport assembly 159 does not require stops to be provided at its outer end since its function is to retrieve discs from pedestal 156 and that the air ports or jets of the track member of transport assembly 159 are disposed to carry discs rearwardly rather than forwardly, each of the two transport assemblies 158, 159 are substantially the same and, accordingly, only the transport assembly 158 is described herein. Transport assembly 158 has a number of similar characteristics to the apparatus described above and, accordingly, shall not be explained in any greater detail than is believed necessary for a clear comprehension of the nature of its construction.

Disc transport assembly 158 includes a eccentrically mounted crank arm 168 comparable to crank arm 47 (described above). Crank arm 168 is mounted on a drive wheel 169, and both are in turn carried on a base plate 171. Track member 164 and base plate 171 are maintained in spaced parallel relation by means of support rods 172 while base plate 171 is supported by a box-shaped panel structure including side panels 173, 174 joined at their trailing edges by a rear plate 176. This box-shaped panel structure is welded at its upper edge along three sides to the edge of base plate 171 in order to provide rigidity to base plate 171 whereby assembly 158 can be mounted securely from hinges 161 without sagging.

The holder 163 for disc transport assembly 158 is operated in the direction of the associated arrow shown thereon by means of an elevator assembly 56 as described above (the holder 163 for disc transport assembly 159 is similarly operated in the direction of the associated arrow shown thereon). Fixed stops 177 employing a downwardly depending pin element (now shown) are disposed in the outer end of track member 164 so that as discs are picked up at holder 163 and transported along track member 164, stops 177 will serve to arrest the disc at a position immediately overlying pedestal 156 provided transport assembly 158 has been pivotally moved to engage base plate 171 with fixed stop 178.

After suitable inspection or treatment of the disc has been accomplished at pedestal 156, transport assembly 159 can be pivotally moved about its hinges 161 to dispose the outer end of its track member 179 immediately over pedestal 156 in closely spaced relation so as to lift the disc located on pedestal 156 and transport the disc rearwardly along track member 179 to the associated holder 163. In this regard, and as noted above, the air vents in track member 179 are oriented substantially as shown in FIG. 18 whereas the air vents in track member 164 are oriented in the manner shown in FIG. 17.

Apparatus for controlling the flow of air or other gas to one or the other or both of air track members 164, 179 includes valves 182, 183, respectively. Accordingly, valve 182 is electrically controlled by a lead 184 from a suitable control unit 186 operated by a keyboard 187 at the left of the operator to couple the manifold of track member 164 via an air line 188 to an air line 189 which is, in turn, connected to a source of air under pressure. Similarly, valve 183 is electrically operated via a lead 191 to couple an air supply line 192 to supply air via an air line 193 into the manifold disposed centrally along track member 179. In this manner air or other gas is discharged from track members 164 and 179 via jets or ports of the type described above in connection with FIGS. 17 and 18, respectively.

Apparatus for moving each disc transport assembly 158 or 159 between advanced and retracted positions so as to properly dispose the end of its associated track member 164 or 179 in disc transfer relation to pedestal 156 comprises a pneumatic actuator 194 or 196 coupled by links 208, 209 to an upstanding wall of base 162 and to the disc transport assembly itself. Each actuator 194, 196 is connected to an associated air line 197 or 198 which is in turn coupled to an electrically operated valve 199 or 201. As controlled by keyboard 187, electrical leads 202, 203 from control unit 186 serve to operate valves 199, 201 for supplying air from air pressure inlets 204, 206 to actuators 194, 196. Each of the actuators 194, 196 includes a spring in order to provide return positioning for each of the transport assemblies 158, 159.

From the foregoing, it will be readily evident that there has been provided an improved dual arm stationary system for handling discs, such as semiconductor wafers or the like. While the system of FIGS. 19 and 20 is shown in conjunction with an optical examination device (microscope 157), it will be evident that discs placed on pedestal 156 can be treated in other ways. For example, they can be coated, cleaned, exposed and chemically treated, tested as to mechanical, electrical and chemical properties, and the like, etc.

What I claim is:

1. In a disc transport system for handling and transporting discs a cyclically moving carrier, a first station for disposing discs onto said carrier, said first station including a member having an elongate surface with a portion overhanging said carrier and with ports for discharging gas downwardly at an angle with respect to that surface for lifting and carrying discs in spaced relation to and along that surface to a position overlying said carrier to be discharged onto said carrier, and a second station for retrieving discs from said carrier, said second station including a member having an elongate surface with a portion overhanging said carrier and with ports for discharging gas downwardly at an angle with respect to that surface for lifting discs from said carrier and carrying them in spaced relation to and along that surface to another location.

2. In a disc transport system for handling and transporting discs a cyclically moving carrier, a loading station for depositing discs onto said carrier, a treatment station disposed adjacent to said carrier for treating discs deposited thereon, and an unloading station for retrieving discs from said carrier, said loading and unloading stations including track members having elongate flat surfaces with portions overhanging said carrier and with gas discharge ports serving to discharge a flow of gas downwardly onto the discs and at an angle with respect to said surfaces for applying a lifting force to the discs to suspend them from said surfaces and for applying a directional force to the discs to move them along said surfaces to deposit discs onto or retrieve discs from said carrier.

3. In a disc-handling system a cyclically moving carrier, a loading station for depositing discs onto said carrier, a treatment station disposed adjacent to said carrier for treating the discs, and an unloading station for retrieving discs from said carrier, said loading and unloading stations including holders for the discs and means overhanging said carrier and having downwardly facing surfaces and ports oriented at an angle with respect to said surfaces for discharging gas downwardly to lift discs upwardly and transport them from one of said holders at the loading station to a position above said carrier for loading onto said carrier and to lift discs from said carrier and transport them into another of said holders at the unloading station.

4. In a disc-handling system according to claim 3 a plurality of loading stations for depositing discs onto said carrier, a plurality of unloading stations for retrieving discs from said carrier, and means for selectively operating said unloading stations to selectively retrieve discs from said carrier after treatment so as to effect a sorting of the treated discs.

5. In a disc-handling system according to claim 3 another cyclically moving carrier, and means for transferring discs from one of said carriers to the other, said last-mentioned means overhanging both of said carriers and having a downwardly facing surface and ports oriented at an angle with respect to said surface for discharging gas downwardly to lift and transport discs from said one of the carriers to the other.

6. In a disc-handling system according to claim 3 means for driving said carrier reciprocally between advanced and retracted positions relative to said treatment station.

7. In a disc-handling system a disc support structure, a first station for depositing discs onto said support structure, said first station including first holder for discs and means overhanging said support structure and having a transport surface and ports therein for discharging air downwardly to sequentially lift discs upwardly and transport them from said first holder to a position above said support structure for loading thereon, and a second station for retrieving discs from said support structure, said second station including a second holder for discs and means overhanging said support structure and having a transport surface and ports therein for discharging air downwardly to sequentially lift discs from said support structure and transport them into said second holder.

8. In a disc-handling system according to claim 7 said support structure includes a cyclic carrier.

9. In a disc-handling system according to claim 7 said support structure includes a stationary device for sequentially receiving discs thereon.

10. In a disc-handling system first means for supporting discs at a given location, second means movable over said first means and having a downwardly facing surface with ports therein for discharging gas downwardly at an angle with respect to that surface for successively transporting discs from a first station along that surface to said first means and depositing them thereon at said given location, and third means movable over said first means and having a downwardly facing surface with ports therein for discharging gas downwardly at an angle with respect to that surface for successively retrieving discs from said first means at said given location and transporting them to a second station.

11. A system for transporting disc-shaped wafers for use in semiconductor manufacture without physically contacting said wafers, by the use of Bernouilli's principle, comprising two spaced, discontinous rail sections each having an underside which forms a substantially flat suspension surface limited by lateral guide means for the movement of said wafers, a longitudinal duct formed inside each rail section, a gas source connected with said duct having a number of inclined gas ejection nozzles extending between said duct and said suspension surface, the orifices of said nozzles being positioned substantially along the longitudinal symmetry line of said suspension surface and the axes of said nozzles having an orientation in said direction of transportation, one rail section being formed in one end for introduction to a prescribed depth into an open-front supply magazine for unloading wafers from individual tracks therein, and the other rail section being formed in one end for introduction to a prescribed depth into a receiving magazine for loading wafers thereinto, movable supporting means having an upwardly facing supporting surface arranged in a co-operative relationship with a spacing to the end of each of said rail sections remote from said one end to receive a wafer transported by said one rail section from said supply magazine, said other rail section having at least one nozzle positioned in an overlying relationship to said supporting surface, said nozzle being inclined at an angle relative to a line perpendicular to the suspension surface of said other rail section to allow attraction of a wafer positioned on the supporting surface when a gas flow is ejected through said nozzle.

12. A system for transporting disc-shaped wafers for use in semiconductor manufacture without physically contacting said wafers, by the use of Bernouilli's principle, comprising two rail sections, each having an underside which forms a substantially flat suspension surface limited by lateral guide means for the movement of said wafers, a longitudinal duct formed inside each rail section, a gas source connected with said duct having a number of inclined gas ejection nozzles extending between said duct and said suspension surface, the orifies of said nozzles being positioned substantially along the longitudinal symmetry line of said suspension surface and the axes of said nozzles having an orientation in said direction of transportation, one rail section being formed in one end for introduction to a prescribed depth into an open-front supply magazine for unloading wafers from individual tracks therein, and the other rail section being formed in one end for introduction to a prescribed depth into a receiving magazine for loading wafers thereinto, supporting means having an upwardly facing supporting surface arranged in a co-operative relationship with a spacing to the end of each of said rail sections remote from said one end to receive a wafer transported by said one rail section from said supply magazine, said other rail section having at least one nozzle positioned in an overlying relationship to said supporting surface, said nozzle being inclined at an angle relative to a line perpendicular to the suspension surface of said other rail section to allow attraction of a wafer positioned on the supporting surface when a gas flow is ejected through said nozzle.

13. A system as in claim 12 wherein said rail sections form parts of a continuous rail, and stop means is provided for protruding from said suspension surface to stop the movement of wafers in the direction from said supply magazine to said receiving magazine at a location between those magazines.

14. A system as in claim 13 wherein said stop means is provided in association with said supporting surface at the junction between said parts.

15. A system as in claim 14 wherein said stop means comprises at least one stop member movable to an extended position protruding from said suspension surface to stop the movement of a wafer from said supply magazine at said location and movable to a retracted position withdrawn from said suspension surface to permit further movement of a wafer from said location to said receiving magazine.

16. A system as in claim 15 wherein said stop means comprises a pair of such stop members each pneumatically operated and spring loaded.

* * * * *